(12) United States Patent
Schieke et al.

(10) Patent No.: US 8,972,219 B2
(45) Date of Patent: Mar. 3, 2015

(54) METHOD AND SYSTEM OF MONITORING ELECTRICAL BRUSHES

(75) Inventors: Sascha Schieke, Simpsonville, SC (US); Aditi Yogin Koppikar, Bangalore (IN); Mark Andrew Sporer, Simpsonville, SC (US); Chongchan Lee, Marietta, GA (US)

(73) Assignee: General Electric Company, Schenectady, NY (US)

( * ) Notice: Subject to any disclaimer, the term of this patent is extended or adjusted under 35 U.S.C. 154(b) by 485 days.

(21) Appl. No.: 13/401,950

(22) Filed: Feb. 22, 2012

(65) Prior Publication Data

US 2013/0218514 A1   Aug. 22, 2013

(51) Int. Cl.
| | | |
|---|---|---|
| G06F 15/00 | (2006.01) | |
| G01B 21/04 | (2006.01) | |
| H01R 39/58 | (2006.01) | |
| H01R 43/14 | (2006.01) | |
| G01R 31/34 | (2006.01) | |

(52) U.S. Cl.
CPC ............. H01R 39/58 (2013.01); H01R 43/14 (2013.01); *Y02E 10/725* (2013.01); *G01R 31/343* (2013.01)
USPC ........... 702/138; 310/178; 310/179; 310/239; 310/242; 310/247; 340/648; 180/65.1

(58) Field of Classification Search
CPC ...... H01R 39/58; H01R 43/14; Y02E 10/725; G01R 31/343
USPC .......... 702/138; 310/178, 179, 239, 242, 247; 340/648; 180/65.1
See application file for complete search history.

(56) References Cited

U.S. PATENT DOCUMENTS

| | | | | |
|---|---|---|---|---|
| 3,835,447 | A  * | 9/1974  | Lowrance ...................... | 367/111 |
| 5,313,950 | A  * | 5/1994  | Ishikawa et al. ............... | 600/462 |
| 6,964,311 | B2 * | 11/2005 | Yang ............................. | 180/65.1 |
| 7,880,362 | B2 * | 2/2011  | Cutsforth et al. ............. | 310/239 |
| 7,994,683 | B2 * | 8/2011  | Cutsforth et al. ............. | 310/239 |
| 2009/0230813 | A1 * | 9/2009  | Cutsforth et al. ............. | 310/242 |
| 2009/0267782 | A1 * | 10/2009 | Mark et al. ..................... | 340/648 |
| 2011/0101820 | A1 * | 5/2011  | Cutsforth et al. ............. | 310/247 |
| 2012/0228529 | A1 * | 9/2012  | Trewin et al. .................. | 250/551 |
| 2014/0009142 | A1 * | 1/2014  | Cauwenberghs ........ | 324/207.11 |
| 2014/0077960 | A1 * | 3/2014  | Cutsforth ...................... | 340/648 |

FOREIGN PATENT DOCUMENTS

| | | |
|---|---|---|
| WO | 2010000350 A1 | 1/2010 |
| WO | 2010015359 A1 | 2/2010 |

OTHER PUBLICATIONS

U.S. Appl. No. 61/451,801.*

(Continued)

*Primary Examiner* — Carol S Tsai
(74) *Attorney, Agent, or Firm* — Ernest G. Cusick; Frank A. Landgraff

(57) ABSTRACT

Described herein are embodiments of methods and systems of monitoring electrical brushes in electrical rotating machinery. One embodiment of the method comprises continuously measuring at least one parameter associated with an electrical brush; and determining, using the at least one continuously measured parameter associated with the electrical brush, maintenance for the electrical brush.

28 Claims, 8 Drawing Sheets

(56) References Cited

OTHER PUBLICATIONS

Argibay, N., Bares, J.A., Sawyer, W.G., "Asymmetric Wear Behavior of Self-Mated Copper Fiber Brush and Slip-Ring Sliding Electrical Contacts in a Humid Carbon Dioxide Environment", Elsevier—Wear, Aug. 2009, pp. 455-463.

Bryant, Michael D., "Wear Rate Reductions in Carbon Brushes, Conducting Current, and Sliding Against Wavy Copper Surfaces", IEEE Transactions in Components, Packaging and Manufacturing Technology, Jun. 1995, Part A, vol. 18, No. 2.

Koenitzer, Jeff D., "The Effect of Spring Pressure of Carbon Brush Wear Rate", Helwig Carbon Products, Inc., Milwaukee, WI, Sep. 2008.

Soua, S., Cebulski, L., Bridge, B., "Online Monitoring of a Power Slip-Ring on the Shaft of a Wind Power Generator", CM of Wind Turbines, DOI: 10.1784/insi.2011.53.6.321, May 5, 2011, pp. 321-329.

"Guide to Ultrasonic Inspection of Fasteners", StressTel Ultrasonic Testing Equipment, 2003, Part No. 021-002-175 Rev. B, Lewistown, PA.

* cited by examiner

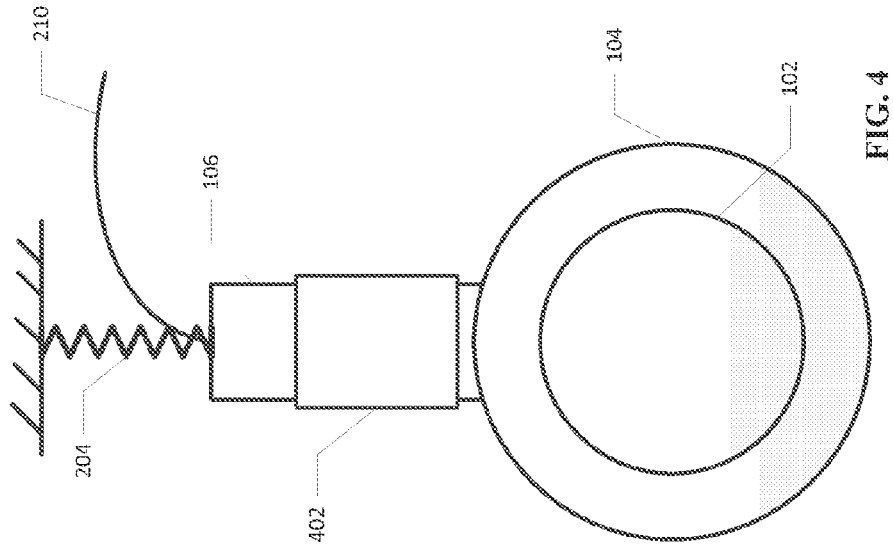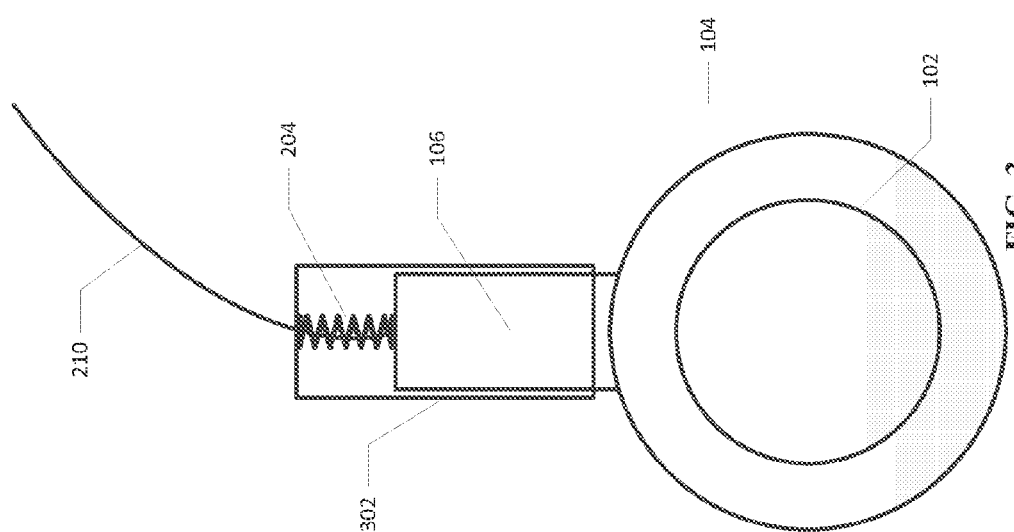

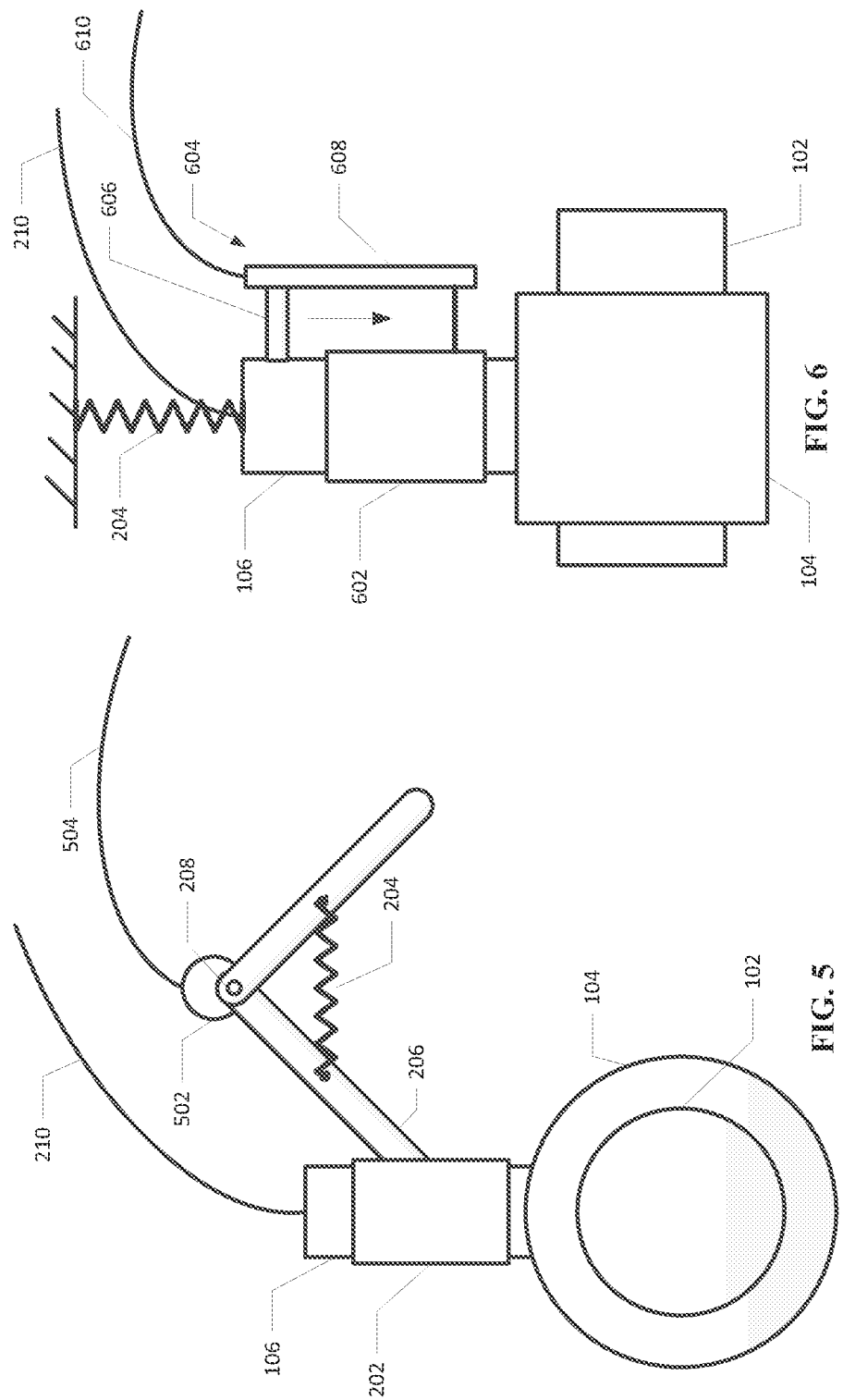

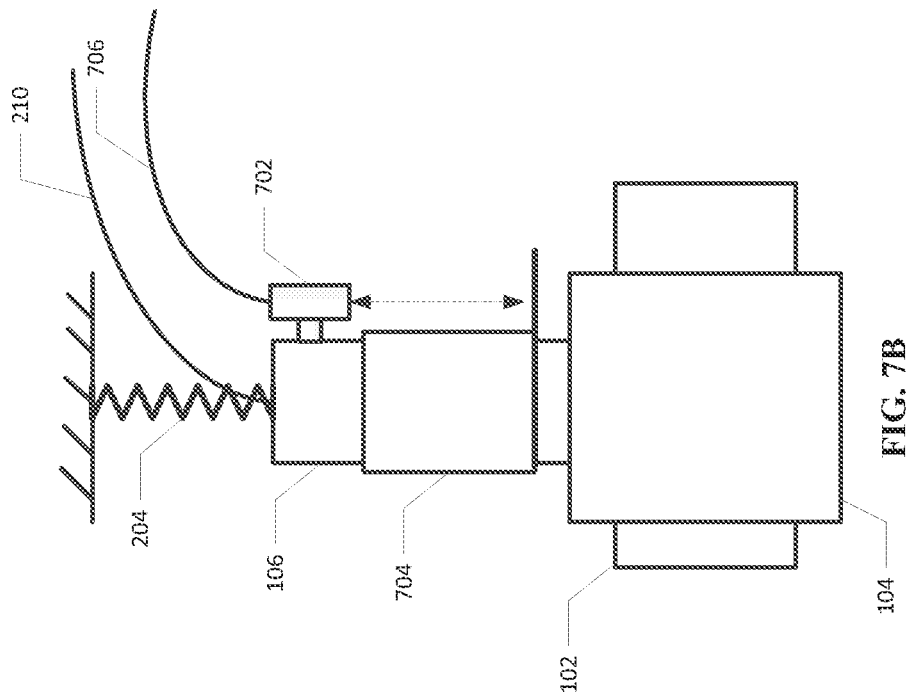
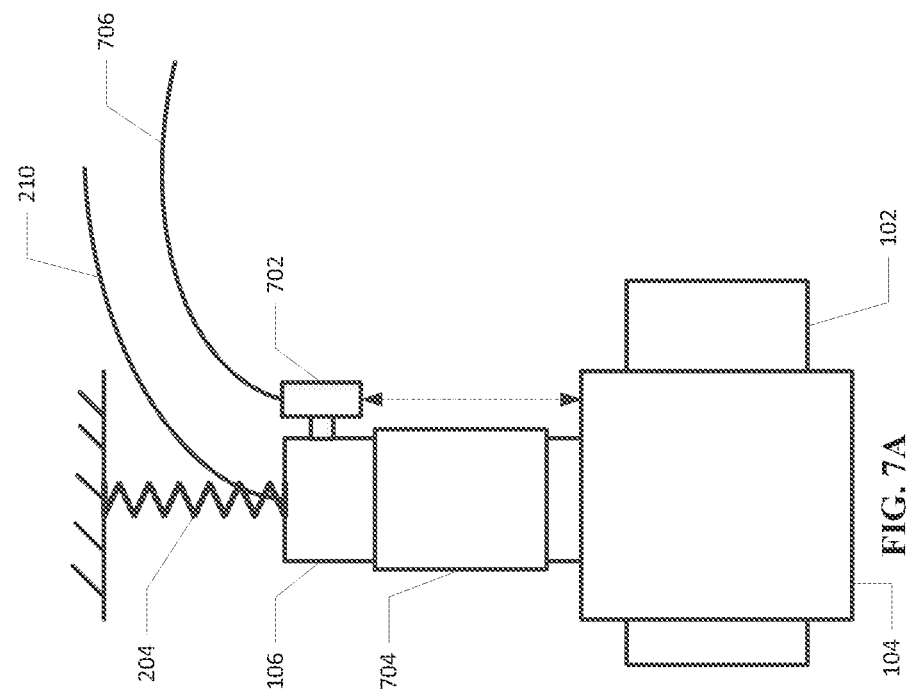

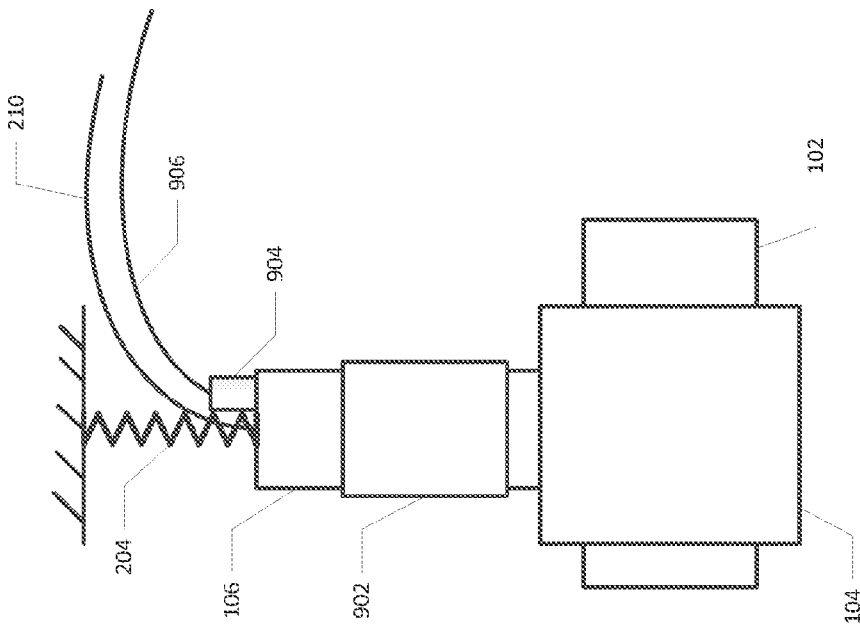
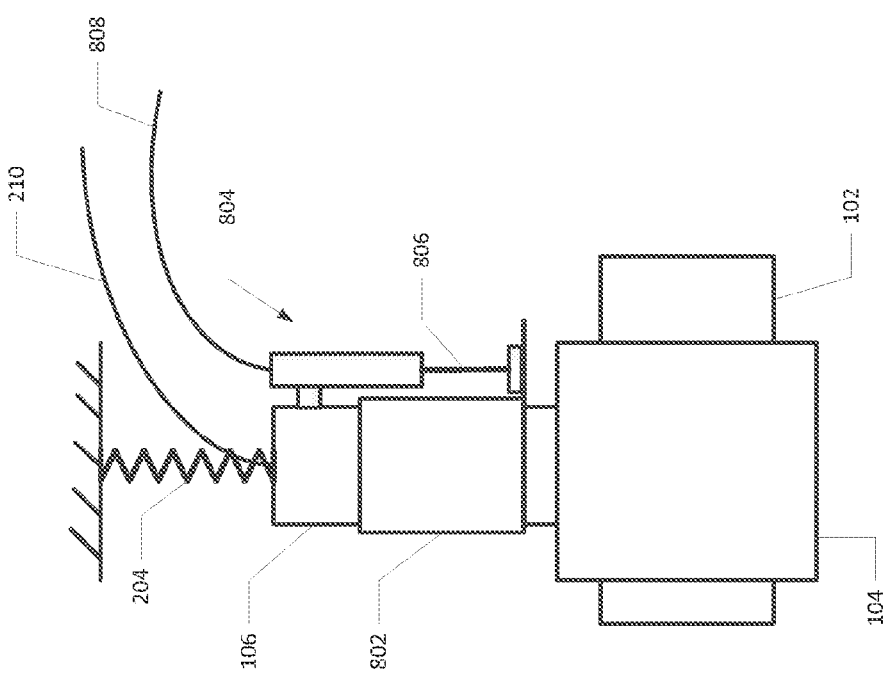

US 8,972,219 B2

METHOD AND SYSTEM OF MONITORING ELECTRICAL BRUSHES

BACKGROUND OF THE INVENTION

Generally, electrical rotating machinery such as generators and motors use slip rings and brushes to transfer current to and receive current from rotor windings mounted on a rotor. For example, FIG. 1 illustrates an embodiment of a rotor 102 having a slip ring 104 mounted on or attached to the rotor 102. An electrical brush 106 is in contact with the slip ring 104. Electrical current passes through the electrical brush 106 into the slip ring 104 or from the slip ring 104 into the electrical brush 106. The electrical brush 106 is typically held in position by a brush holder (not shown). Also, typically one or more springs (not shown) are used to apply pressure to the electrical brush so that contact between the brush 106 and the slip ring 104 is continuous as the slip ring 104 is rotated by the rotor. Typically, the electrical brush 106 is at least partially comprised of conductive carbon graphite. This material tends to wear over time as the slip ring 104 rotates under the electrical brush 106. The wear of the brush 106 depends on many parameters as e.g. temperature, humidity, eccentricity of the rotor, contact force, speed of the rotor, etc. Information about the influence of different parameters on brush wear can be found in, for example, M. Wuerfel and W. Hofmann, "Monitoring and Diagnostics of the Rotor Slip Ring System of Three Phase Current Induction Generators," TU-Chemnitz, 2002; M. Bryant, A. Tewari and J-A Lin, "Wear Rate Reductions in Carbon Brushes, Conducting Current, and Sliding Against Wavy Copper Surfaces," IEE Transactions on Components, Packaging and Manufacturing Technology-Part A, Vol. 18, No. 2, June 1995; among others. Due to the large variety of parameters which have an influence on the wear of the brushes 106, it is not easy to determine their remaining lifetime. This wear can eventually result in failure of the brush 106 or the slip ring 104 if these components are not maintained. As the electrical brush 106 typically wears faster than the slip ring 104, maintenance usually involves replacement of the electrical brush 106. Electrical brushes 106 are designed with this wear in mind. Therefore, they can wear down a certain extent before replacement is required. In some instances, though, maintenance is performed on a time basis, not on the basis of the condition of the brush 106. This may result in costly down-time of the electrical rotating machinery that may not be required. In other instances, the brush 106 may be fitted with a micro-switch that triggers when the brush 106 is worn to a predetermined extent; however, this prevents planned and scheduled maintenance of the brush 106 as it will require replacement when the switch trips.

In some instances, the electrical rotating machinery utilizing the brush 106 and slip ring 104 arrangement can be a generator such but not limited to as a doubly-fed induction generator (DFIG) used in a wind turbine. As described herein, the micro-switch reduces the risk of catastrophic failures to the generator and therefore to the whole wind turbine. However, it still causes unplanned maintenance which is more expensive than scheduled maintenance and therefore not desired. In relation to the growing number of wind turbines under full service agreements (FSA) the implementation of an improved brush wear monitoring system is desired.

Therefore, systems and methods are desired that overcome challenges in the art, some of which are described above.

BRIEF DESCRIPTION OF THE INVENTION

Described herein are embodiments of methods and systems of continuously monitoring parameters associated with an electrical brush in an electrical rotating machine.

One aspect comprises a method of monitoring electrical brushes in electrical rotating machinery. One embodiment of the method comprises continuously measuring at least one parameter associated with an electrical brush; and determining, using the at least one continuously measured parameter associated with the electrical brush, maintenance for the electrical brush.

In another aspect, a system is described. One embodiment of the system is comprised of an electrical brush; and an electrical brush parameter measurement device, wherein the electrical brush parameter measurement device continuously measures at least one parameter associated with the electrical brush and the at least one continuously measured parameter associated with the electrical brush is used to determine maintenance for the electrical brush.

In yet another aspect, a wind turbine is described. One embodiment of the wind turbine comprises a rotor; a slip ring mounted on the rotor; an electrical brush in contact with the slip ring; and an electrical brush parameter measurement device, wherein the electrical brush parameter measurement device continuously measures at least one parameter associated with the electrical brush and the at least one continuously measured parameter associated with the electrical brush is used to determine maintenance for the electrical brush.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 3 illustrates an alternate embodiment of a rotor having a slip ring mounted on the rotor and an electrical brush in contact with the slip ring, wherein a spring is compressed by a fixed brush holder, thus exerting force on the brush and keeping it in contact with the slip ring;

FIG. 4 illustrates yet another alternate embodiment of a rotor having a slip ring mounted on the rotor and an electrical brush in contact with the slip ring, wherein a spring is compressed and affixed external to a fixed brush holder, thus exerting force on the brush and keeping it in contact with the slip ring;

FIG. 5 illustrates an embodiment of a rotor having a slip ring mounted on the rotor, an electrical brush in contact with the slip ring and a brush holder configured to hold the brush in place as the slip ring rotates and to apply pressure to the brush to keep it in contact with the slip ring, further comprising a rotational position sensor mounted on the pivot point of the brush holder;

FIG. 6 illustrates an embodiment of a rotor having a slip ring mounted on the rotor, an electrical brush in contact with the slip ring and a fixed brush holder configured to hold the brush in place as the slip ring rotates, further comprising a position encoder mounted on the brush and the brush holder;

FIGS. 7A and 7B illustrate embodiments of a rotor having a slip ring mounted on the rotor, an electrical brush in contact with the slip ring and a fixed brush holder configured to hold the brush in place as the slip ring rotates, further comprising a proximity sensor mounted on the brush;

FIG. 8 illustrates another embodiment of a rotor having a slip ring mounted on the rotor, an electrical brush in contact with the slip ring and a fixed brush holder configured to hold the brush in place as the slip ring rotates, further comprising a linear actuator mounted on the brush and the linear actuator having a plunger portion that is in contact with a portion of the brush holder;

FIG. 9 illustrates another embodiment of a rotor having a slip ring mounted on the rotor, an electrical brush in contact with the slip ring and a fixed brush holder configured to hold the brush in place as the slip ring rotates, further comprising one or more ultrasonic transducers mounted on the brush;

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
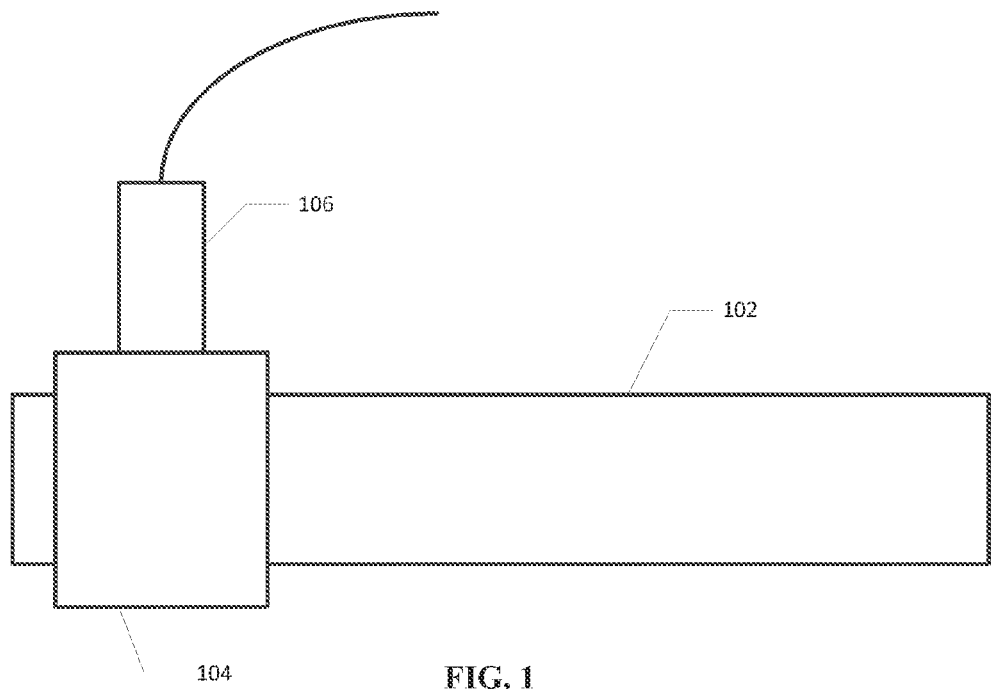
FIG. 1 illustrates a prior art embodiment of a rotor having a slip ring mounted on the rotor and an electrical brush in contact with the slip ring.
Figure 2:
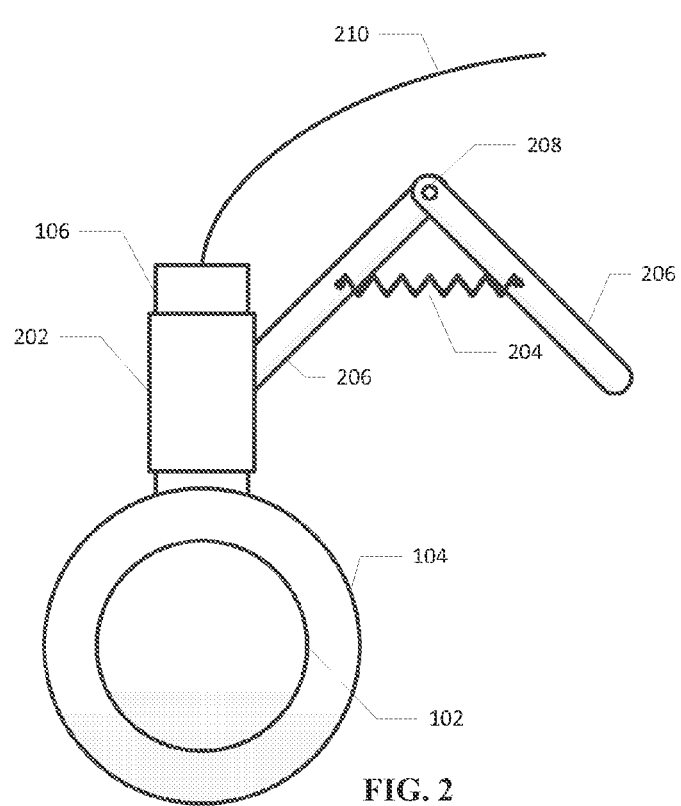
FIG. 2 illustrates an axial view of an embodiment of a rotor having a slip ring mounted on the rotor and an electrical brush in contact with the slip ring, further comprising an embodiment of a brush holder configured to hold the brush in place as the slip ring rotates and to apply pressure to the brush to keep it in contact with the slip ring.

Referring to FIG. 2, an illustration of one type of system that would benefit from embodiments of the present invention is provided. FIG. 2 illustrates an axial view of an embodiment of a rotor 102 having a slip ring 104 mounted on the rotor 102 and an electrical brush 106 in contact with the slip ring 104. Further comprising the embodiment of FIG. 2 is a brush holder 202 configured to hold the brush 106 in place as the slip ring 104 rotates and to apply pressure to the brush 106 to keep it in contact with the slip ring 104. The embodiment shown in FIG. 2 comprises a spring 204 and two radial arms 206 having a pivot point 208, wherein tension in the spring 204 causes downward pressure on the electrical brush 106, thus keeping it in contact with the slip ring 104. As the brush 106 wears, spring tension causes the radial arms 206 rotate about the pivot point 208. It is to be appreciated that this is only one example of a configuration of a spring 204 and brush holder 202 and that any other spring 204 and brush holder 202 configuration is considered within the scope of embodiments of the present invention. Further comprising the embodiment of FIG. 2 is electrical wiring 210 for carrying electrical current to or from the electrical brush 206.

FIG. 3 illustrates an alternate embodiment of a rotor 102 having a slip ring 104 mounted on the rotor 102 and an electrical brush 106 in contact with the slip ring 104, wherein a spring 204 is compressed by a fixed brush holder 302, thus exerting force on the brush 106 and keeping it in contact with the slip ring 104. In this configuration, as the brush 106 wears, it moves outwardly from the brush holder 302. It is to be appreciated that this is only one example of a configuration of a spring 204 and brush holder 302 and that any other spring 204 and brush holder 302 configuration is considered within the scope of embodiments of the present invention.

FIG. 4 illustrates yet another alternate embodiment of a rotor 102 having a slip ring 104 mounted on the rotor 102 and an electrical brush 106 in contact with the slip ring 104, wherein a spring 204 is compressed and affixed external to a fixed brush holder 402, thus exerting force on the brush 106 and keeping it in contact with the slip ring 104. In this configuration, as the brush 106 wears, it moves through the brush holder 402. It is to be appreciated that this is only one example of a configuration of a spring 204 and brush holder 402 and that any other spring 204 and brush holder 402 configuration is considered within the scope of embodiments of the present invention.

FIGS. 5-9 illustrate embodiments of a system for continuously measuring at least one parameter associated with the electrical brush. Generally, the system can be comprised of an electrical brush 106; and, an electrical brush parameter measurement device such as, for example, a rotational position sensor, a position encoder, a proximity sensor, an ultrasonic transducer, and the like. The electrical brush parameter measurement device can be installed permanently on a brush, brush holder, or other equipment associated with the brush, or it may be used as a temporary measurement (e.g., held in place by hand) for taking the desired measurements. Generally, the measured parameter includes brush length, but can be other parameters such as brush integrity as determined by an ultrasonic transducer and the like, wherein the electrical brush parameter measurement device continuously measures at least one parameter associated with the electrical brush 106 and the at least one continuously measured parameter associated with the electrical brush is used to determine maintenance for the electrical brush. In one aspect, the electrical brush parameter measurement device can be a smart sensor having on board data processing capabilities for making calculations such as remaining brush life from the measured brush parameter. In other aspects, outputs from the brush parameter measurement device can be transmitted to a computing device where calculations such as remaining brush life can be made from the measured brush parameter. Maintenance can include for example repairing or replacing the brush 106. Determining maintenance can also include for example determining a remaining lifetime of the brush 106 in order to determine an optimal point in time for repair or replacement of the electrical brush 106.

FIG. 5 illustrates an embodiment of a rotor 102 having a slip ring 104 mounted on the rotor 102, an electrical brush 106 in contact with the slip ring 104 and brush holder 202 configured to hold the brush 106 in place as the slip ring 104 rotates and to apply pressure to the brush 106 to keep it in contact with the slip ring 104 of FIG. 2, further comprising a rotational position sensor 502 mounted on the pivot point 208 of the brush holder 202. In one aspect, the rotational position sensor 502 can be a rotational positional sensor as available from Baumer (Baumer Group, Frauenfeld, Switzerland), among others. The rotational position sensor 502 mounted on the brush holder 202 can measure linear distance or rotational distance about the pivot point 208 as the brush 106 wears, thus measuring the amount of brush material used. Knowing how much brush material has been used, the remaining life of the brush 106 can be determined by calculating a calibrated start point or length of brush material minus distance traveled. The information obtained continuously by the rotational positional sensor 502 can be transmitted either wirelessly or wired 504 to a computing device (not shown) and then be converted to an algorithm indicating x % or remaining brush material left.

FIG. 6 illustrates an embodiment of a rotor 102 having a slip ring 104 mounted on the rotor 102, an electrical brush 106 in contact with the slip ring 104 and a fixed brush holder 602 configured to hold the brush 106 in place as the slip ring 104 rotates, further comprising a position encoder 604 mounted on the brush 106 and the brush holder 602. It is to be appreciated that this embodiment of a system to monitor the electrical brush 106 can be used with brush holder embodiments such as those shown in FIGS. 3 and 4, among others, and that the fixed portion of the position encoder 604 can be affixed to mechanisms other than the brush holder 602. The shown embodiment is exemplary only. In one aspect, the position encoder 604 can be an R-Series (models RP and RH) position encoder as available from MTS Sensors (MTS Sensors Corp., Cary, N.C.), among others. The position encoder 604 comprises a moving part 606 that is affixed to the brush 106 and a fixed part 608 that is mounted to the brush holder 602 or another fixed mechanism. As the brush 106 wears, it moves through the brush holder 602, thus changing the position of the moving portion 606 of the position encoder 604 on the fixed portion 608. This position of the moving part 606 relative to the fixed part 608 creates a signal in the position encoder 604 that can be transmitted wirelessly or wired 610 to a computing device (not shown) and used to measure the amount of brush material used. Knowing how much brush material has been used, the remaining life of the brush 106 can be determined by calculating a calibrated start point or length of brush material minus distance traveled. The information obtained continuously by the position encoder 604 can be converted to an algorithm indicating x % or remaining brush material left.

FIGS. 7A and 7B illustrate embodiments of a rotor 102 having a slip ring 104 mounted on the rotor 102, an electrical brush 106 in contact with the slip ring 104 and a fixed brush holder 704 configured to hold the brush 106 in place as the slip ring 104 rotates, further comprising a proximity sensor 702 mounted on the brush 106. The proximity sensor can be, for example, an ultrasonic proximity sensor, a microwave proximity sensor, an optical (including laser) proximity sensor, a magnetic proximity sensor, a capacitive proximity sensor, and the like. It is to be appreciated that this embodiment of a system to monitor the electrical brush 106 can be used with brush holder embodiments such as those shown in FIGS. 3 and 4, among others. The shown embodiment is exemplary only. In one aspect, the proximity sensor 704 can be an XS inductive sensors (e.g., XSDH603629) as available from Schneider Electric (Schneider Electric SA, Rueil Malmaison—France), among others. The proximity sensor 702 can be configured to detect the distance between the proximity sensor 702 and another object such as the slip ring 104 (FIG. 7A), a portion of the brush holder 704 (FIG. 7B), and the like. As the proximity sensor 702 is affixed to the brush 106, as the brush wears, the distance between the proximity sensor 702 and another object such as the slip ring 104 (FIG. 7A), a portion of the brush holder 704 (FIG. 7B), and the like, decreases. This position change in the proximity sensor 702 relative to the slip ring 104 (FIG. 7A), a portion of the brush holder 704 (FIG. 7B), and the like, creates a signal in the proximity sensor 702 that can be transmitted wirelessly or wired 706 to a computing device (not shown) and used to measure the amount of brush material used. Knowing how much brush material has been used, the remaining life of the brush 106 can be determined by calculating a calibrated start point or length of brush material minus distance traveled. The information obtained continuously by the proximity sensor 702 can be converted to an algorithm indicating x % or remaining brush material left.

FIG. 8 illustrates another embodiment of a rotor 102 having a slip ring 104 mounted on the rotor 102, an electrical brush 106 in contact with the slip ring 104 and a fixed brush holder 802 configured to hold the brush 106 in place as the slip ring 104 rotates, further comprising a linear actuator 804 mounted on the brush 106 and having a plunger portion 806 that is in contact with a portion of the brush holder 802. It is to be appreciated that this embodiment of a system to monitor the electrical brush 106 can be used with brush holder embodiments such as those shown in FIGS. 3 and 4, among others, and that the plunger portion 806 of the linear actuator 804 can be in contact with fixed mechanisms other than the brush holder 802. The shown embodiment is exemplary only. In one aspect, the linear actuator 804 can be an LCA25-series linear actuator (e.g., LCA25-010-5) as available from SMAC (SMAC Inc., Carlsbad, Calif.), among others. As noted above, the linear actuator 804 comprises a plunger portion 806 that is in contact with a portion of the brush holder 802 or another fixed mechanism. As the brush 106 wears, it moves through the brush holder 802, thus changing the position of the plunger portion 806. This position of the plunger portion 806 relative to the fixed portion of the linear actuator 804 creates a signal in the linear actuator 804 that can be transmitted wirelessly or wired 808 to a computing device (not shown) and used to measure the amount of brush material used. Knowing how much brush material has been used, the remaining life of the brush 106 can be determined by calculating a calibrated start point or length of brush material minus distance traveled. The information obtained continuously by the linear actuator 804 can be converted to an algorithm indicating x % or remaining brush material left.

FIG. 9 illustrates another embodiment of a rotor 102 having a slip ring 104 mounted on the rotor 102, an electrical brush 106 in contact with the slip ring 104 and a fixed brush holder 902 configured to hold the brush 106 in place as the slip ring 104 rotates, further comprising one or more ultrasonic transducers 904 mounted on the brush 106. As noted above, the one or more ultrasonic transducers 904 can be mounted on the brush either temporarily or permanently. In one aspect, the travel time of ultrasonic waves within the brush 106, as measured by the one or more ultrasonic transducers 904, can be used to measure the length of the brush 106. Together with the known velocity of the ultrasonic waves in the brush 106, the brush length can be determined with an accuracy of at least one tenth of a millimeter. The ultrasonic waves are generated by a transducer 904 mounted either permanently or temporarily on the brush 106. The one or more ultrasonic transducers create a signal that can be transmitted wirelessly or wired 906 to a computing device (not shown) and used to measure the amount of brush material used. Such wiring 906 can also provide power to the one or more ultrasonic transducers 904. Typically, these transducers need a voltage of around 300-400 volts, though in other embodiments sputtered ultrasonic transducers can be used, which usually can be operated at lower voltages (~25-40 Volts). Furthermore, as ultrasonic transducers can be used for non-destructive testing, the one or more transducers 904 can provide integrity information about the brush 106 such as whether the brush 106 is cracked or if it has voids.

As the brush 106 is pressed onto the slip-ring 104 due to the tension spring 204, the stress acting along the brush length can have an influence on the longitudinal velocity of the ultrasonic waves. The higher the spring pressure, the higher is the velocity of the ultrasonic waves. Also, the temperature of the brush 106 can have an influence on its wave velocity. However, both effects can be compensated as described in Stresstel, "Guide to Ultrasonic Inspection of Fasteners," Rev. B, 2003, incorporated by reference herein. It should be noted that the calibration curve for the pressure compensation also enables spring pressure to be determined. Spring pressure can be used to determine the remaining lifetime of the brush 106.

Figure 10:
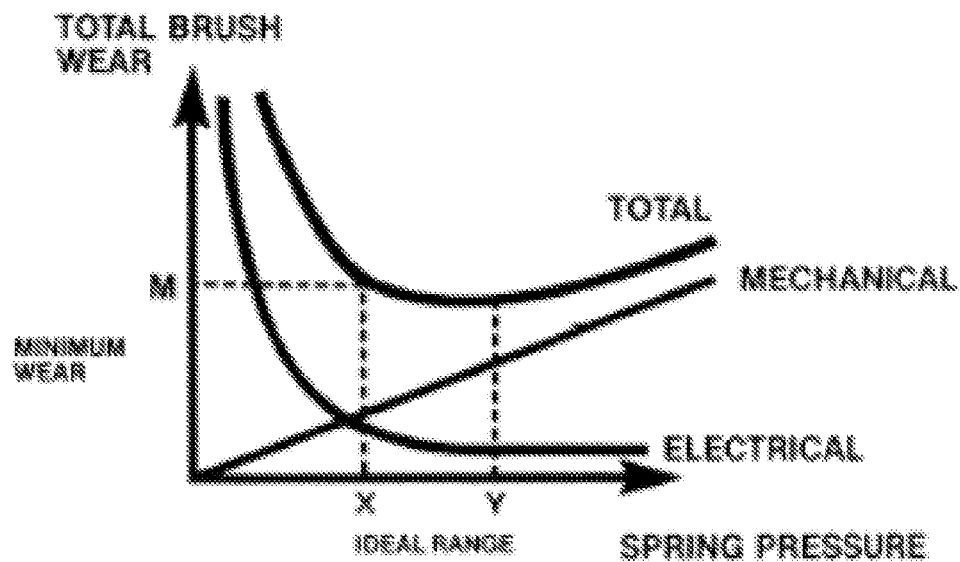
FIG. 10 is a diagram illustrating total wear on an electrical brush that can be used to set a spring pressure on the brush and to predict a lifetime for the brush.

By determining how much brush material has been used, the remaining life of the brush 106 can be determined by calculating a calibrated start point or length of brush material minus distance traveled. The information obtained continuously by the one or more ultrasonic transducers 904 can be converted to an algorithm indicating x % or remaining brush material left. For example, in order to be able to decide if a brush has to be replaced during the next scheduled maintenance or if the remaining lifetime is sufficient to move the replacement to a following scheduled maintenance, the main causes for brush wear should be taken into account. According to Koenitzer, J., "The effect of spring pressure on carbon brush wear rate," Helwig Carbon Products Inc., 2008, incorporated by reference, spring pressure is the main factor causing brush wear. It causes mechanical wear due to friction as well as electrical wear due to a voltage drop at the surface of the brush. Both relations can be illustrated in a diagram as shown in FIG. 10, as found in Koenitzer. The resulting curve shows also that an ideal range for the spring pressure exists.

Figure 11:
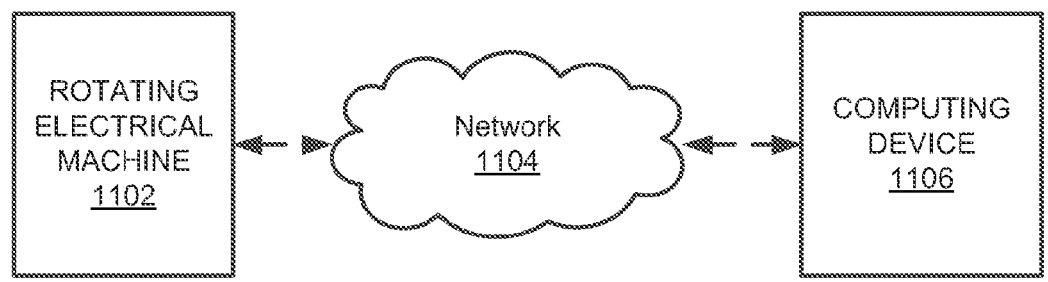
FIG. 11 is an exemplary system for performing aspects of the present invention.

FIG. 11 is an exemplary system for performing aspects of the present invention. As shown in FIG. 11, signals from the electrical brush parameter measurement device such as, for example, a rotational position sense, a position encoder, a proximity sensor, an ultrasonic transducer, and the like described above can be transmitted from the electrical rotating machine 1102 containing the electrical brush parameter measurement device over a network 1104 to a computing device 1106. In one aspect, the electrical rotating machine 1102 can be, for example, a wind turbine generator such as a doubly-fed induction generator. In other aspects, the electrical rotating machine 1102 can be various electric motors or generators. In one aspect, the network 1104 can be a supervisory control and data acquisition (SCADA) network as are known in the art. In another aspect, the network 1104 can be the Internet. Other networks are contemplated within the scope of embodiments of the present invention. The network 1104 can be wired (including fiber optic), wireless or a combination thereof. Once the signals are received by the computing device 1106 from the electrical rotating machine 1102, they can be used to determine various information about the brush 106 such as brush length, brush integrity, lifetime of the brush, and the like.

For example, if the electrical brush parameter measurement device comprises one or more ultrasonic transducers 904 as described in relation to FIG. 9, the brush length L(t) and the spring pressure P(t) can be determined by the computing device 1106 from signals received from the one or more ultrasonic transducers 904. Wear can be defined as the change of the brush length $\Delta L$. Therefore, the system as shown in FIG. 11 can record the time-series $\{\Delta L_k\}$ and $\{P_k\}$, which can be illustrated in a diagram as illustrated in FIG. 10. It should be noted that during the lifetime of a brush 106, the spring pressure decreases over time. That corresponds to movement along the total wear curve from the right to the left in the diagram shown in FIG. 10. After entering the ideal range of pressure, wear reaches its minimum M at a certain spring pressure x. Further decrease of the spring pressure is related to a significant increase in wear. Displaying the time-series $\{\Delta L_k\}$ against $\{P_k\}$ therefore allows the status of the brush in the $\Delta L$-P-diagram of FIG. 10 to be determined. Linear regression or nonlinear regression of the time-series $\{\Delta L_k\}$ as allows the future wear of the brushes to be modeled. The information about the status in the $\Delta L$-P-diagram as well as the modeled future wear can then be used to determine the optimal time to replace the brushes.

Similarly, if the electrical brush parameter measurement device comprises a rotational position sensor, a position encoder, a proximity sensor, an ultrasonic transducer, and the like, as described in relation to FIGS. 5-8, signals from theses brush parameter measurement devices can be used to estimate remaining brush life in accordance with the following algorithm that can be executed on the computing device 1106.

Brush wear, $L_W$, can be determined where, $L_W$=starting brush length (calibrated)—current length as determined by a brush parameter measurement device. Operational brush wear rate $\Delta L_W/\Delta T$ can be determined, where $\Delta T$ is the period in which the slip ring was actually rotating. For example, this could be the period in which a wind turbine was actually producing power. To estimate the brush wear $L_{W12}$ over the next 12 months, a reference time $T_{ref}$ is needed, which reflects the typical period in a year in which the slip ring is actually rotating (or the wind turbine is actually producing power). For example, data from other wind turbines of the same wind farm or from comparable wind farms with comparable environmental conditions can be used to determine a reference time $T_{ref}$. If multiple sets are taken, a mean $T_{ref}$ and a standard deviation $\Delta T_{ref}$ can be obtained. The estimated brush wear over the next 12 months can then be given by: $L_{W12}=(\Delta L_W/\Delta T)*T_{ref}$. According to error analysis, the error $\Delta L_{W12}$ can be determined by: $\Delta L_{W12}=(\Delta L_W/\Delta T)*\Delta T_{ref}$. Based on the estimated brush wear for the next 12 months, a decision can be made whether the brush needs to be replaced now or not. Alternatively, future brush wear rate can be predicted by fitting a regression curve on the time-series of brush wear rate $\{\Delta L_W/\Delta T\}$. Subsequent multiplication with the reference time $(T_{ref}\pm\Delta T_{ref})$ delivers the estimated brush wear over the next 12 months and the accordant error.

Figure 12:
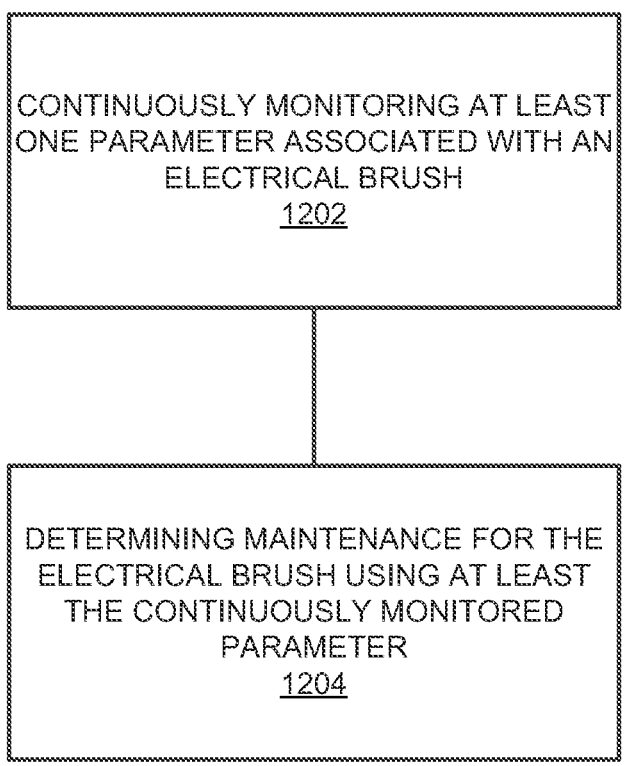
FIG. 12 is an exemplary flowchart illustrating the operations that may be taken for continuously monitoring parameters associated with an electrical brush in an electrical rotating machine.

Referring now to FIG. 12, the operations are illustrated that may be taken for continuously monitoring parameters associated with an electrical brush in an electrical rotating machine. At Step 1202, at least one parameter associated with an electrical brush is continuously monitored. In one aspect, continuously measuring the at least one parameter associated with the electrical brush comprises continuously measuring a length value for the electrical brush. In one aspect, determining, using the at least one continuously measured parameter associated with the electrical brush, maintenance for the electrical brush comprises determining whether to replace the electrical brush based at least in part on the length value for the electrical brush. In various aspects, continuously measuring the length value for the electrical brush comprises using one or more of a linear actuator, proximity sensor, position encoder, or a rotational position sensor placed on a pivot point of a brush holder associated with the electrical brush to continuously measure the length value of the electrical brush. In one aspect, an output of the one or more linear actuator, proximity sensor, position encoder, or a rotational position sensor placed on a pivot point of a brush holder associated with the electrical brush is transmitted to a remote monitoring station over a network. In one aspect, the network comprises a supervisory control and data acquisition (SCADA) network. In one aspect, continuously measuring the length value for the electrical brush comprises measuring a travel time of ultrasonic waves within the electrical brush and determining the length value for the electrical brush from the measured travel time of the ultrasonic waves. In one aspect, continuously measuring the length value for the electrical brush comprises measuring a travel time of ultrasonic waves within the electrical brush and determining the length value for the electrical brush from the measured travel time of the ultrasonic waves comprises using one or more ultrasonic sensors mounted to the electrical brush to measure the travel time of ultrasonic waves within the electrical brush. In one aspect, an output from the one or more ultrasonic sensors mounted to the electrical brush is transmitted to a remote monitoring station over a network. In one aspect, the network comprises a SCADA network. In one aspect, continuously measuring the at least one parameter associated with the electrical brush further comprises measuring a spring pressure on the electrical brush using a wave velocity of the ultrasonic waves within the electrical brush. In one aspect, determining, using the at least one continuously measured parameter associated with the electrical brush, maintenance for the electrical brush comprises determining when to replace the electrical brush based at least in part on the brush length and the spring pressure.

At step 1204, maintenance for the electrical brush is determined using the at least one continuously measured parameter associated with the electrical brush. In one aspect, determining, using the at least one continuously measured parameter associated with the electrical brush, maintenance for the electrical brush comprises determining when to replace the electrical brush.

The above system has been described above as comprised of units. One skilled in the art will appreciate that this is a functional description and that software, hardware, or a combination of software and hardware can perform the respective functions. A unit, such as an electrical device, sensor, a computing device, a network, a vendor or manufacturer's computing device, etc., can be software, hardware, or a combination of software and hardware. In one exemplary aspect, the units can comprise a computing device 1106 as referenced above and further described below.

Figure 13:
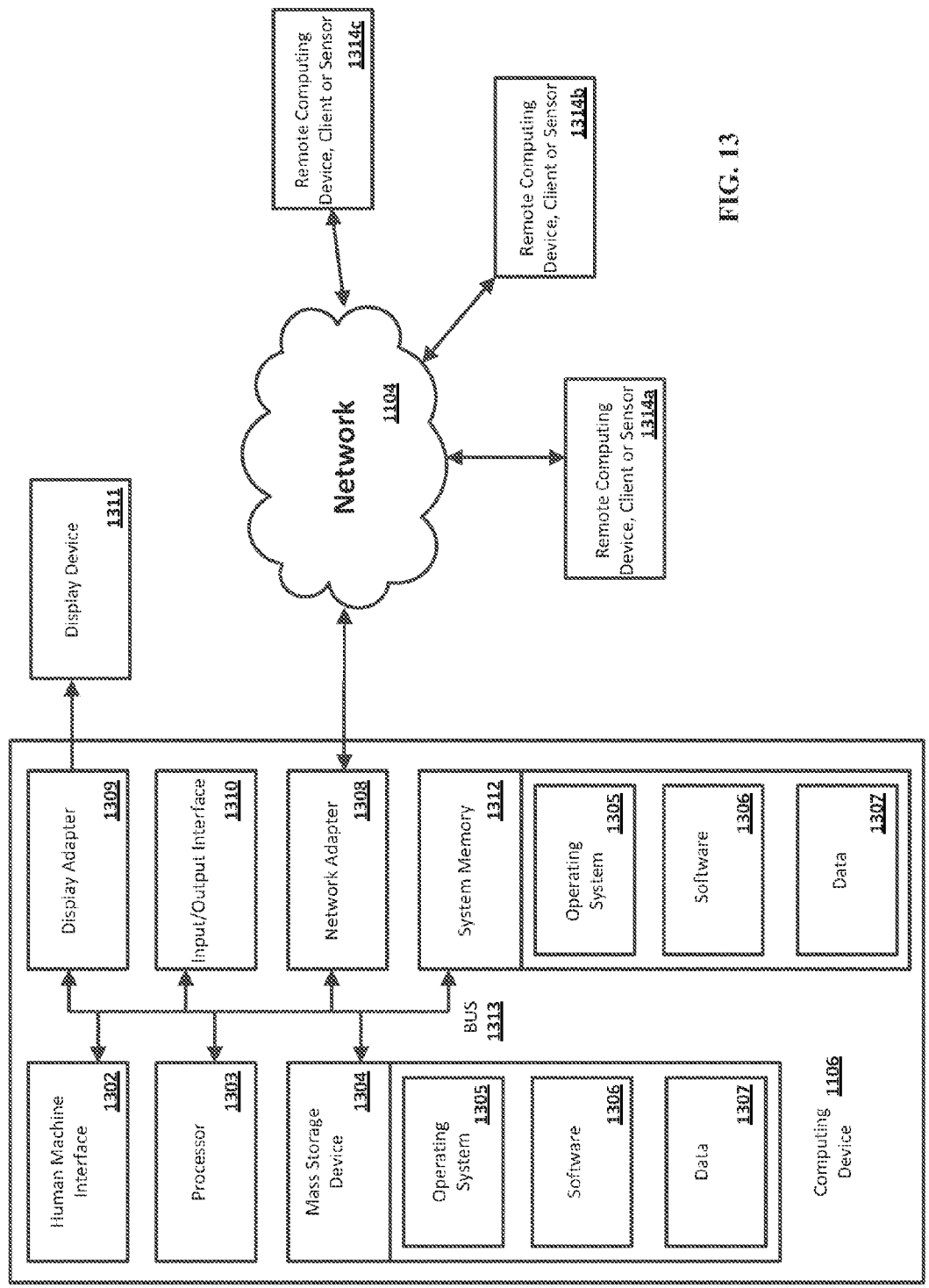
FIG. 13 is a block diagram illustrating an exemplary operating environment for performing operations associated with the disclosed methods and algorithms.

FIG. 13 is a block diagram illustrating an exemplary operating environment for performing operations associated with the disclosed methods and algorithms. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, smart meters, smart-grid components, SCADA masters, distributed computing environments that comprise any of the above systems or devices, and the like.

The processing of the disclosed methods, algorithms and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that aspects of the systems and methods disclosed herein can be implemented via a computing device 1106. The components of the computing device 1106 can comprise, but are not limited to, one or more processors or processing units 1303, a system memory 1312, and a system bus 1313 that couples various system components including the processor 1303 to the system memory 1312. In the case of multiple processing units 1303, the system can utilize parallel computing. In one aspect, the processor 1303 is configured to receive electrical brush parameter data over a network 1104 from one or more electrical brush parameter measurement devices such as one or more of a linear actuator, proximity sensor, position encoder, or a rotational position sensor placed on a pivot point of a brush holder, ultrasonic transducer, and the like.

The system bus 1313 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 1313, and all buses specified in this description can also be implemented over a wired or wireless network connection and each of the subsystems, including the processor 1303, a mass storage device 1304, an operating system 1305, software 1306, data 1307, a network adapter 1308, system memory 1312, an Input/Output Interface 1310, a display adapter 1309, a display device 1311, and a human machine interface 1302, can be contained within one or more remote computing devices, or clients 1314a,b,c at physically separate locations, connected through buses of this form, in effect implementing a fully distributed system or distributed architecture. Furthermore, the computing device can communicate with one or more electrical brush parameter measurement devices as described herein over the network 1104.

The computing device 1106 typically comprises a variety of computer readable media. Exemplary readable media can be any available media that is non-transitory and accessible by the computing device 1106 and comprises, for example and not meant to be limiting, both volatile and non-volatile media, removable and non-removable media. The system memory 1312 comprises computer readable media in the form of volatile memory, such as random access memory (RAM), and/or non-volatile memory, such as read only memory (ROM). The system memory 1312 typically contains data 1307 such as data associated with the curves of FIG. 10 and/or program modules such as operating system 1305 and software 1306 that are immediately accessible to and/or are presently operated on by the processing unit 1303. In one aspect, the system memory 1312 contains computer executable codes sections for performing the steps of receiving data related to continuously measuring at least one parameter associated with an electrical brush and determining, using the at least one continuously measured parameter associated with the electrical brush, maintenance for the electrical brush.

In another aspect, the computing device 1106 can also comprise other non-transitory, removable/non-removable, volatile/non-volatile computer storage media. By way of example, FIG. 13 illustrates a mass storage device 1304 that can provide non-volatile storage of computer code, computer readable instructions, data structures, program modules, and other data for the computing device 1106. For example and not meant to be limiting, a mass storage device 1304 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 1304, including by way of example, an operating system 1305 and software 1306. Each of the operating system 1305 and software 1306 (or some combination thereof) can comprise elements of the programming and the software 1306. Data 1307 can also be stored on the mass storage device 1304. Data 1307 can be stored in any of one or more databases known in the art. Examples of such databases comprise, DB2® (IBM Corporation, Armonk, N.Y.), Microsoft® Access, Microsoft® SQL Server, (Microsoft Corporation, Bellevue, Wash.), Oracle®, (Oracle Corporation, Redwood Shores, Calif.), mySQL, PostgreSQL, and the like. The databases can be centralized or distributed across multiple systems.

In another aspect, the user can enter commands and information into the computing device 1106 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the processing unit 1303 via a human machine interface 1302 that is coupled to the system bus 1313, but can be connected by other interface and bus structures, such as a parallel port, game port, an IEEE 1394 Port (also known as a Firewire port), a serial port, or a universal serial bus (USB).

In yet another aspect, a display device 1311 can also be connected to the system bus 1313 via an interface, such as a display adapter 1309. It is contemplated that the computing device 1106 can have more than one display adapter 1309 and the computing device 1106 can have more than one display device 1311. For example, a display device can be a monitor, an LCD (Liquid Crystal Display), or a projector. In addition to the display device 1311, other output peripheral devices can comprise components such as speakers (not shown) and a printer (not shown), which can be connected to the computer 1106 via input/output interface 1310. Any step and/or result of the methods can be output in any form to an output device. Such output can be any form of visual representation, including, but not limited to, textual, graphical, animation, audio, tactile, and the like.

The computing device 1106 can operate in a networked environment using logical connections to one or more remote computing devices, clients or sensors 1314a,b,c, which includes a cloud computing arrangement. By way of example, a remote computing device 1314 can be a personal computer, portable computer, a server, a router, a network computer, a smart meter, a vendor or manufacture's computing device, smart grid components, a SCADA master, a DRMS processor, a DMS processor, a peer device or other common network node, and so on. Logical connections between the computing device 1106 and a remote computing device or sensor 1314a, b,c can be made via a local area network (LAN) and a general wide area network (WAN). Such network connections can be through a network adapter 1308. A network adapter 1308 can be implemented in both wired and wireless environments. Such networking environments are conventional and commonplace in offices, enterprise-wide computer networks, intranets, and other networks 1106 such as a supervisory control and data acquisition (SCADA) network, the Internet, and the like.

For purposes of illustration, application programs and other executable program components such as the operating system 1305 are illustrated herein as discrete blocks, although it is recognized that such programs and components reside at various times in different storage components of the computing device 1106, and are executed by the data processor(s) of the computer. An implementation of software 1306 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 1303 discussed above with reference to FIG. 13 to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 1303 of FIG. 13) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method, comprising:
 continuously measuring at least one parameter associated with an electrical brush;
 determining, using the at least one continuously measured parameter associated with the electrical brush, maintenance for the electrical brush, wherein continuously measuring the at least one parameter associated with the electrical brush comprises continuously measuring a length value for the electrical brush, wherein continuously measuring the length value for the electrical brush comprises measuring a travel time of ultrasonic waves within the electrical brush and determining the length value for the electrical brush from the measured travel time of the ultrasonic waves, and wherein continuously measuring the at least one parameter associated with the electrical brush further comprises measuring a spring pressure on the electrical brush using a wave velocity of the ultrasonic waves within the electrical brush.

2. The method of claim 1, wherein determining, using the at least one continuously measured parameter associated with the electrical brush, maintenance for the electrical brush comprises determining when to replace the electrical brush.

3. The method of claim 1, wherein determining, using the at least one continuously measured parameter associated with the electrical brush, maintenance for the electrical brush comprises determining whether to replace the electrical brush based at least in part on the length value for the electrical brush.

4. The method of claim 1, wherein continuously measuring the length value for the electrical brush comprises using one or more of a linear actuator, proximity sensor, position encoder, or a rotational position sensor placed on a pivot point of a brush holder associated with the electrical brush to continuously measure the length value of the electrical brush.

5. The method of claim 4, wherein an output of the one or more linear actuator, proximity sensor, position encoder, or a rotational position sensor placed on a pivot point of a brush holder associated with the electrical brush is transmitted to a remote monitoring station over a network.

6. The method of claim 5, wherein the network comprises a supervisory control and data acquisition (SCADA) network.

7. The method of claim 1, wherein continuously measuring the length value for the electrical brush comprises measuring a travel time of ultrasonic waves within the electrical brush and determining the length value for the electrical brush from the measured travel time of the ultrasonic waves comprises using one or more ultrasonic sensors mounted to the electrical brush to measure the travel time of ultrasonic waves within the electrical brush.

8. The method of claim 7, wherein an output from the one or more ultrasonic sensors mounted to the electrical brush is transmitted to a remote monitoring station over a network.

9. The method of claim 8, wherein the network comprises a supervisory control and data acquisition (SCADA) network.

10. The method of claim 1, wherein determining, using the at least one continuously measured parameter associated with the electrical brush, maintenance for the electrical brush comprises determining when to replace the electrical brush based at least in part on the brush length and the spring pressure.

11. A system, comprised of:
an electrical brush; and
an electrical brush parameter measurement device, wherein the electrical brush parameter measurement device continuously measures at least one parameter associated with the electrical brush and said at least one continuously measured parameter associated with the electrical brush is used to determine maintenance for the electrical brush, wherein the electrical brush parameter measurement device continuously measuring the at least one parameter associated with the electrical brush comprises the electrical brush parameter measurement device continuously measuring a length value for the electrical brush, wherein the electrical brush parameter measurement device comprises using one or more ultrasonic sensors mounted to the electrical brush to measure the travel time of ultrasonic waves within the electrical brush continuously measuring the length value for the electrical brush comprises determining the length value for the electrical brush from the measured travel time of the ultrasonic waves, and wherein continuously measuring the at least one parameter associated with the electrical brush further comprises measuring a spring pressure on the electrical brush using a wave velocity of the ultrasonic waves within the electrical brush.

12. The system of claim 11, wherein determining, using the at least one continuously measured parameter associated with the electrical brush, maintenance for the electrical brush comprises determining when to replace the electrical brush.

13. The system of claim 11, wherein determining, using the at least one continuously measured parameter associated with the electrical brush, maintenance for the electrical brush comprises determining whether to replace the electrical brush based at least in part on the length value for the electrical brush.

14. The system of claim 11, wherein the electrical brush parameter measurement device comprises one or more of a linear actuator, proximity sensor, position encoder, or a rotational position sensor placed on a pivot point of a brush holder associated with the electrical brush to continuously measure the length value of the electrical brush.

15. The system of claim 14, wherein an output of the one or more linear actuator, proximity sensor, position encoder, or a rotational position sensor placed on a pivot point of a brush holder associated with the electrical brush is transmitted to a remote monitoring station over a network.

16. The system of claim 15, wherein the network comprises a supervisory control and data acquisition (SCADA) network.

17. The system of claim 11, wherein an output from the one or more ultrasonic sensors mounted to the electrical brush is transmitted to a remote monitoring station over a network.

18. The system of claim 17, wherein the network comprises a supervisory control and data acquisition (SCADA) network.

19. The system of claim 11, wherein determining, using the at least one continuously measured parameter associated with the electrical brush, maintenance for the electrical brush comprises determining when to replace the electrical brush based at least in part on the brush length and the spring pressure.

20. A wind turbine generator comprised of:
a rotor;
a slip ring mounted on the rotor;
an electrical brush in contact with the slip ring; and
an electrical brush parameter measurement device, wherein the electrical brush parameter measurement device continuously measures at least one parameter associated with the electrical brush and said at least one continuously measured parameter associated with the electrical brush is used to determine maintenance for the electrical brush, wherein the electrical brush parameter measurement device continuously measuring the at least one parameter associated with the electrical brush comprises the electrical brush parameter measurement device continuously measuring a length value for the electrical brush, wherein the electrical brush parameter measurement device comprises using one or more ultrasonic sensors mounted to the electrical brush to measure the travel time of ultrasonic waves within the electrical brush continuously measuring the length value for the electrical brush comprises determining the length value for the electrical brush from the measured travel time of the ultrasonic waves, and wherein continuously measuring the at least one parameter associated with the electrical brush further comprises measuring a spring pressure on the electrical brush using a wave velocity of the ultrasonic waves within the electrical brush.

21. The wind turbine generator of claim 20, wherein determining, using the at least one continuously measured parameter associated with the electrical brush, maintenance for the electrical brush comprises determining when to replace the electrical brush.

22. The wind turbine generator of claim 20, wherein determining, using the at least one continuously measured parameter associated with the electrical brush, maintenance for the electrical brush comprises determining whether to replace the electrical brush based at least in part on the length value for the electrical brush.

23. The wind turbine generator of claim 20, wherein the electrical brush parameter measurement device comprises one or more of a linear actuator, proximity sensor, position encoder, or a rotational position sensor placed on a pivot point of a brush holder associated with the electrical brush to continuously measure the length value of the electrical brush.

24. The wind turbine generator of claim 23, wherein an output of the one or more linear actuator, proximity sensor, position encoder, or a rotational position sensor placed on a pivot point of a brush holder associated with the electrical brush is transmitted to a remote monitoring station over a network.

25. The wind turbine generator of claim 24, wherein the network comprises a supervisory control and data acquisition (SCADA) network.

26. The wind turbine generator of claim 20, wherein an output from the one or more ultrasonic sensors mounted to the electrical brush is transmitted to a remote monitoring station over a network.

27. The wind turbine generator of claim 26, wherein the network comprises a supervisory control and data acquisition (SCADA) network.

28. The wind turbine generator of claim 20, wherein determining, using the at least one continuously measured parameter associated with the electrical brush, maintenance for the electrical brush comprises determining when to replace the electrical brush based at least in part on the brush length and the spring pressure.

* * * * *